(12) United States Patent
Kostuchowski et al.

(10) Patent No.: US 7,567,075 B2
(45) Date of Patent: Jul. 28, 2009

(54) SINGLE LATCH MANUAL ACTUATOR FOR TESTING MICROCIRCUITS, AND HAVING A MECHANICAL INTERLOCK FOR CONTROLLING OPENING AND CLOSING

(76) Inventors: Cory R. Kostuchowski, 22374 Sunrise Rd. NE., Stacy, MN (US) 55079; Dennis B. Shell, 7243 40th St. West, Webster, MN (US) 55088; Brian K. Warwick, 200 Caledonium St., Ben Lomond, CA (US) 95005

( * ) Notice: Subject to any disclaimer, the term of this patent is extended or adjusted under 35 U.S.C. 154(b) by 0 days.

(21) Appl. No.: 11/483,416

(22) Filed: Jul. 7, 2006

(65) Prior Publication Data

US 2007/0029811 A1    Feb. 8, 2007

Related U.S. Application Data

(63) Continuation of application No. 11/254,511, filed on Oct. 20, 2005, now Pat. No. 7,202,657.

(60) Provisional application No. 60/620,880, filed on Oct. 21, 2004, provisional application No. 60/747,897, filed on May 22, 2006, provisional application No. 60/697,848, filed on Jul. 8, 2005.

(51) Int. Cl.
    *G01R 31/02*    (2006.01)
(52) U.S. Cl. .................................. 324/158.1; 324/755

(58) Field of Classification Search ......... 324/754–765; 439/62–72, 331
See application file for complete search history.

(56) References Cited

U.S. PATENT DOCUMENTS

| | | | | |
|---|---|---|---|---|
| 4,962,356 A | * | 10/1990 | Eberlein et al. | ............. 324/755 |
| 5,387,120 A | * | 2/1995 | Marks et al. | ................. 439/331 |
| 5,791,914 A | * | 8/1998 | Loranger et al. | ............. 439/71 |
| 5,997,316 A | * | 12/1999 | Kunzel | ........................ 439/73 |
| 6,982,551 B2 | * | 1/2006 | Yates | ...................... 324/158.1 |
| 7,042,238 B2 | * | 5/2006 | Tani | ........................... 324/755 |

* cited by examiner

*Primary Examiner*—Vinh P Nguyen
(74) *Attorney, Agent, or Firm*—Nawrocki, Rooney & Sivertson, P.A.

(57) ABSTRACT

An actuator device applies force to an integrated circuit package to enable temporary contact between a plurality of contacts on the integrated circuit package and to a set of test contacts carried on a contactor support. A cover is hinged at one side, and rotates to position that allows an actuator element to apply force through a lead backer to the integrated circuit package or its leads, pressing the integrated circuit contacts against the test contacts. A latch opposite to the hinge holds the cover in the closed position. An interlock mechanism may be provided to prevent operating the latch unless the actuator element has withdrawn the lead backer from the integrated circuit or its leads, thereby preventing damage to components.

6 Claims, 6 Drawing Sheets

SINGLE LATCH MANUAL ACTUATOR FOR TESTING MICROCIRCUITS, AND HAVING A MECHANICAL INTERLOCK FOR CONTROLLING OPENING AND CLOSING

CROSS-REFERENCE TO RELATED APPLICATIONS

This is a regular application filed under 35 U.S.C. § 111(a) claiming priority, under 35 U.S.C. § 119(e)(1), of provisional application Ser. Nos. 60/747,897 previously filed May 22, 2006 and 60/697,848 previously filed Jul. 8, 2005 under 35 U.S.C. § 111(b), and;

This is further a continuation of copending application Ser. No. 11/254,511 filed on Oct. 20, 2005, now U.S. Pat. No. 7,202,657, which claims priority of Provisional Application Ser. No. 60/620,880, filed on Oct. 21, 2004.

BACKGROUND OF THE INVENTION

The present invention comprises a manual actuator mechanism for establishing temporary electrical contact between a contactor and the leads or pads forming the connectors of an integrated circuit device. The contactor is an array of contacts forming an electrical interface between the connectors on the integrated circuit device package and, for example, an electronic circuit board, which may form part of an integrated circuit testing system. Typically, the contactor forms the floor of a well whose walls are oriented to precisely position the integrated circuit relative to the contactor.

The mechanism includes a manual actuator that pushes a lead backer against the integrated circuit package or leads on the package, forcing the integrated circuit's leads or pads against the contacts of the contactor as the lead backer reaches the end of its travel. An alignment plate mounted above the contactor guides the integrated circuit package and lead backer to their proper position in the x-y plane.

BRIEF DESCRIPTION OF THE INVENTION

A single latch manual actuator device applies force to an integrated circuit package to enable temporary contact between a plurality of contacts on the integrated circuit package and having a predetermined alignment respecting each other and the package, to an array of test contacts carried on a contactor support, and having a predetermined alignment matching the predetermined alignment of the integrated circuit package contacts. The actuator device includes an alignment plate with an opening surrounding the test contacts for positioning an integrated circuit with respect to the test contacts.

The actuator device comprises a frame for attaching to the contactor support and enclosing the test contacts, and including opposing first and second walls. The first wall of the frame includes a latch engagement feature. The actuator device comprises a frame for attaching and enclosing the contactor support, and including opposing first and second walls. The first wall of the frame includes a latch engagement feature.

A cover is hinged to the frame on the second wall, and is rotatable from a closed position covering the frame to an open position.

An actuator element is mounted on the cover. The actuator element has a lead backer. The actuator element is movable between advanced and retracted positions for placing the lead backer respectively into and out of engagement with an integrated circuit positioned within the alignment plate opening.

A latch is mounted on a second side of the cover opposed to the first side of the cover, and cooperates with the latch engagement feature to fasten the cover in the closed position. The latch has latched and unlatched positions.

An improved version of the actuator device has a latch that includes an interlock feature with which the actuator interferes when the actuator element is in the advanced position. In this version, the manually operable element interferes with the interlock feature when the actuator element is in the advanced position.

Preferably, the manually operable element comprises a knob mounted for rotation on the cover. The knob has a cylindrical periphery. The actuator element includes an angled ramp or slot causing the knob to advance toward the cover while moving from the retracted to the advanced position. The latch includes a projection interferingly projecting toward the cylindrical knob periphery when the latch is in the latched position and the actuator element is in the advanced position. That is, the latch projection prevents operating the latch to allow the cover to open.

DETAILED DESCRIPTION OF THE INVENTION

Figure 1:
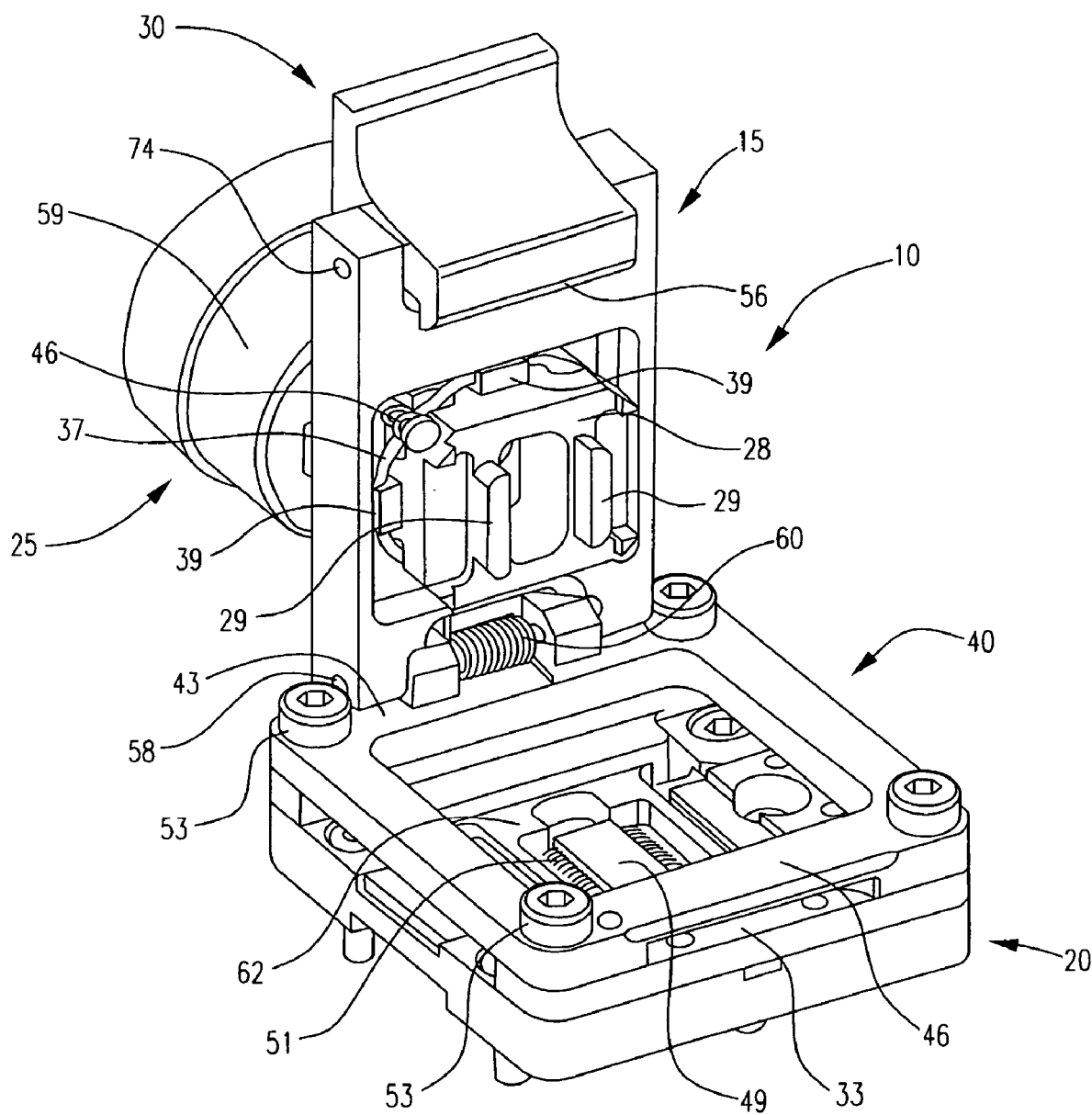
FIG. 1 is a perspective view of an actuator device for pressing the terminals of an integrated circuit against contacts of a contactor support.
Figure 2:
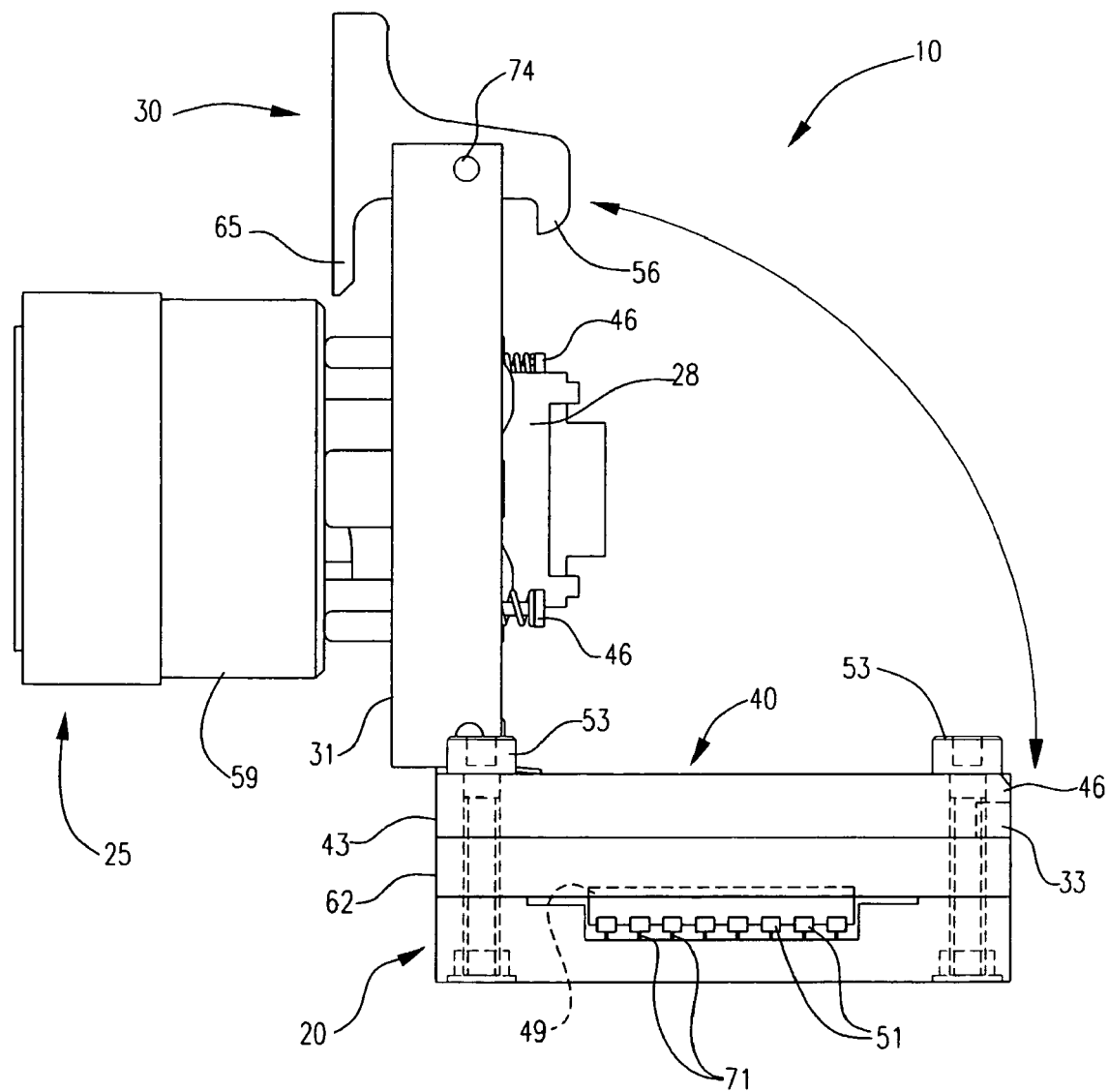
FIG. 2 is a side elevation view of the actuator device with a cover thereof in an open position.

FIG. 1 shows a manual actuator device 10 whose purpose is to press leads or contacts 51 of an integrated circuit 49 tightly and temporarily against an array of contacts 71 (shown in FIG. 2). Actuator 10 moves a lead backer 28 until projections 29 thereon force leads 51 into electrical connection with contacts 71 while electrical testing of integrated circuit 49 occurs. Contacts 71 are designed with compliance so that minor deviations in the alignment or thickness of individual leads 51 do not affect the quality of the electrical contact.

Figure 5:
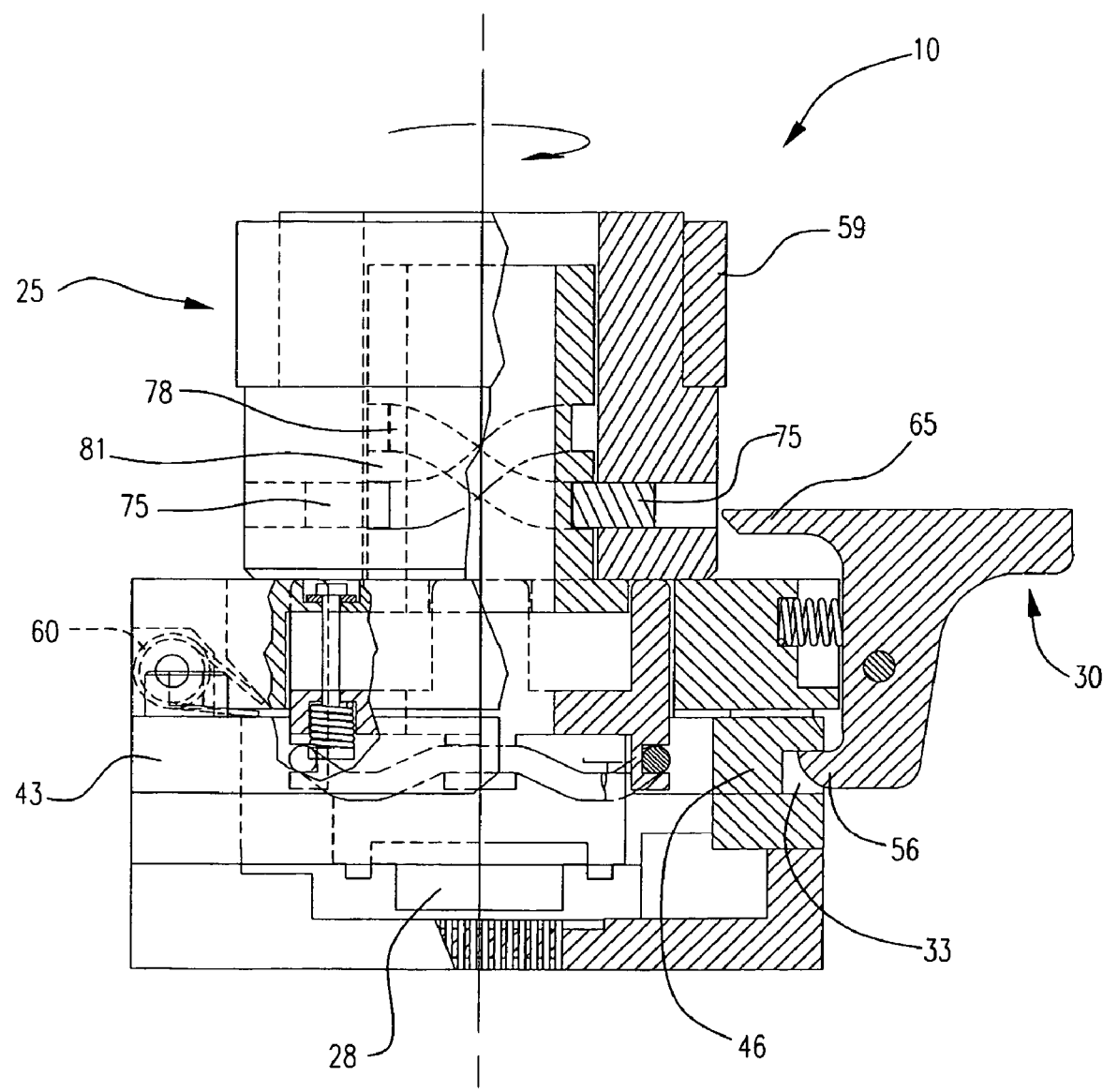
FIG. 5 is a side elevation section view of the actuator device with the cover thereof in a closed and latched position, but with an actuator element thereof in an advanced position.

A frame 40 and a cover 15 form major elements of actuator device 10. A pin 58 hinges cover 15 to a first wall 43 of frame 40. Pin 58 allows cover 15 to rotate from an open position shown in FIGS. 1-3 to a closed position such as shown in FIG. 5 for example. A spring 60 conveniently holds cover 15 in the open position of FIGS. 1-3.

Frame 40 is to be attached to a contactor support 20 on which is mounted the contactor array comprising the matrix of contacts 71. Support 20 may also include a heat sink and testing circuitry, not shown.

Cover 15 carries a latch 30 and an actuator element 25. A pin 74 mounts latch 30 for rotation on the end of cover 15. When cover 15 rotates into the closed position of FIG. 4, a tooth 56 of latch 30 can engage a slot 33 on the outer surface of frame wall 46. Slot 33 comprises a latch engagement feature. While shown as a slot 33, the latch engagement feature can easily also comprise a projection.

Figure 3:
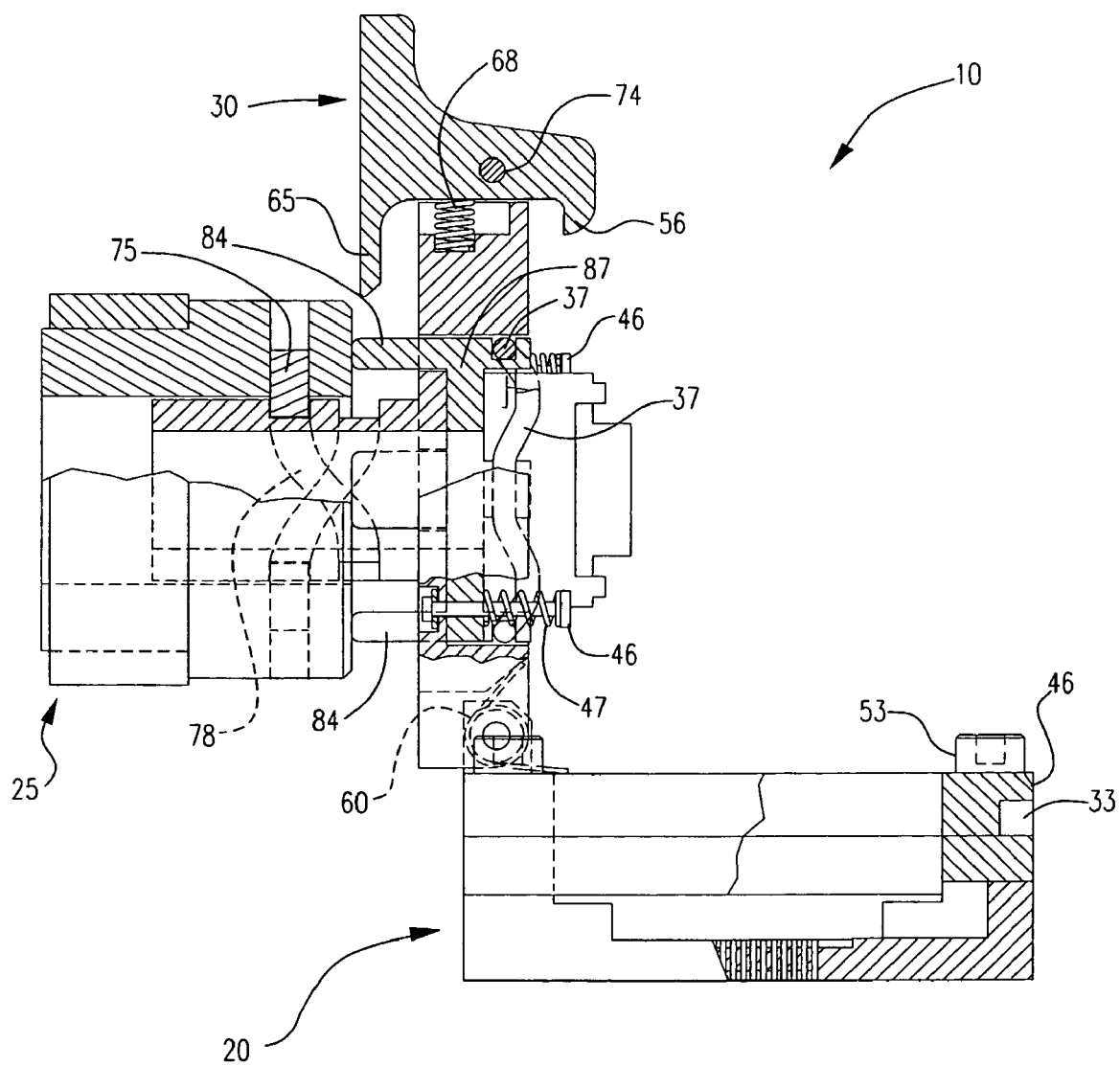
FIG. 3 is a side elevation section view of the actuator device with the cover thereof in an open position.

A spring 68 shown in FIG. 3 biases latch 30 for clockwise rotation, which urges tooth 56 into engagement with slot 33. When desired, an operator can rotate latch 30 counterclockwise to release tooth 56 from slot 33 and allow cover 15 to rotate to the open position. While shown with tooth 56 engaging slot 33, in fact any variation in topology or thickness of wall 46 with which tooth 56 can engage is adequate to lock cover 15 in the closed position.

Figure 4:
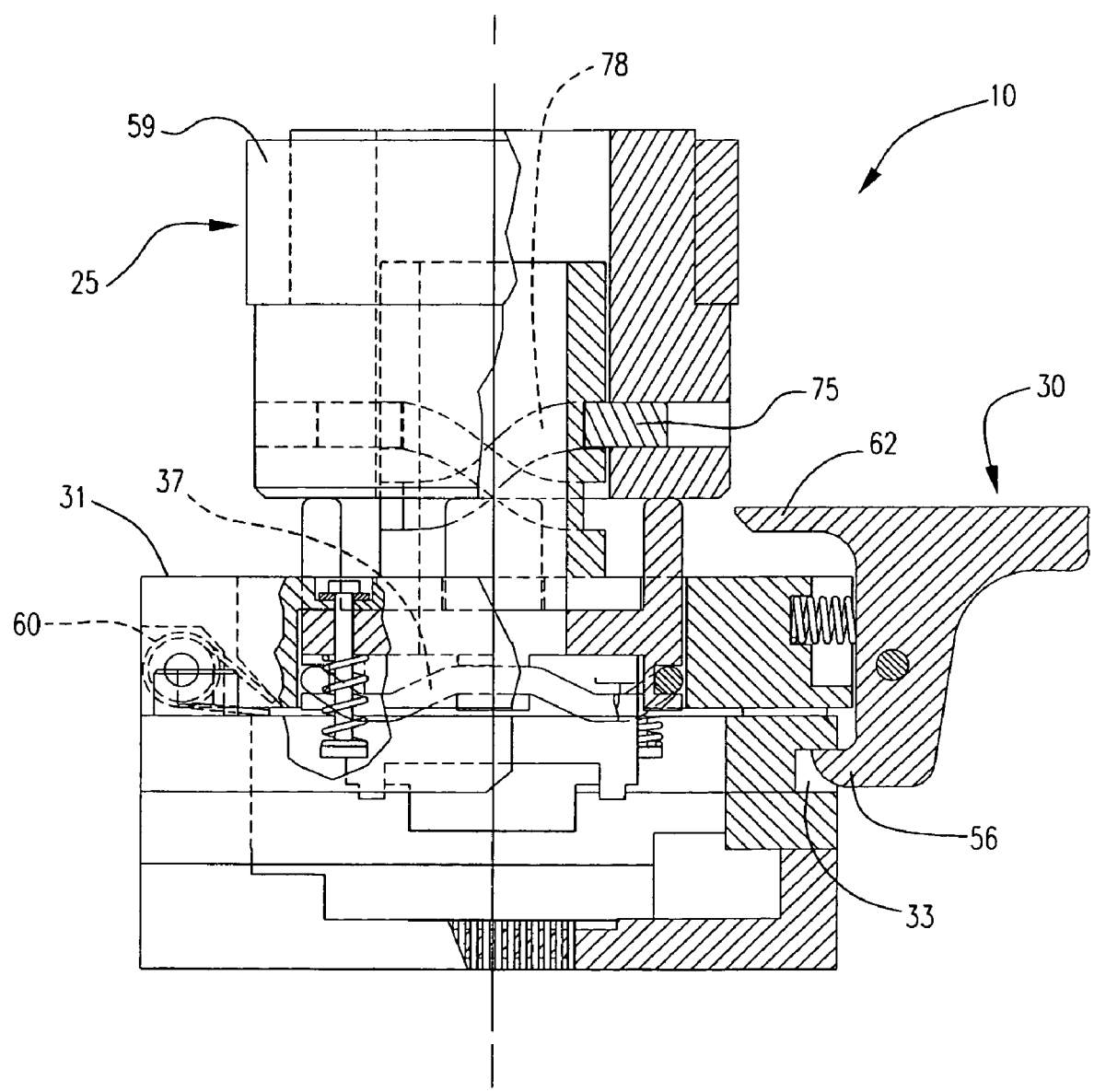
FIG. 4 is a side elevation section view of the actuator device with the cover thereof in a closed and latched position, but with an actuator element thereof in a retracted position.

Actuator element 25 serves to move the lead backer 29 between an advanced position shown in FIG. 5 and a retracted position shown in FIG. 4. Cover 15 has a projecting cylindrical axle 81 having an axis extending perpendicularly from the outer cover surface 31, hereafter the Z-axis direction. Cylinder 81 has a pair of sloped grooves 78 around the cylindrical periphery, each in opposed relation to the other. Grooves 78 smoothly transition from a point quite close to the cover surface 31, to a point removed from cover surface 31.

A knob 59 has a circular bore into which axle 81 fits, allowing knob 59 to rotate on axle 81. Knob 59 carries a pair of follower pins 75 that extend radially inward through the knob's circular bore to fit into angled slots or grooves 78 on cover 15. Pins 75 serve to retain knob 59 on axle 81 and by cooperation of pins 75 with the ends of grooves 81, limit the rotation of knob 59.

As an operator rotates knob 59, knob 59 translates along the axis of axle 81 from the retracted position of FIG. 4 to the advanced position of FIG. 5. The translation results from the camming action of pins 75 within grooves 78 when knob 59 rotates.

Cover 15 has a carrier 87 mounted for Z axis translation. Carrier 87 has integral push rods that penetrate cover surface 15 and extend to contact the periphery of knob 59. A pair of retainer pins 46 project from cover 15 away from surface 31 and through holes in carrier 87. Pins 46 have heads on the ends thereof, and carry compression springs 47 between the heads of pins 46 and the adjacent areas of carrier 87. Springs 47 press the ends of push rods 84 against the adjacent facing surface of knob 59.

The lead backer 28 mounts on carrier 87 by an elastic band or O-ring 37 that fits in slotted projections on lead backer 28 and carrier 87. This allows for quick replacement of lead backer 28.

An alignment plate 62 has an aperture precisely shaped to match the outer shape of lead backer projections 29. Alignment plate 62 then guides lead backer 28 into precise registration with leads 51.

In use, an integrated circuit 49 is placed in position for testing within the alignment plate 62 aperture and against the contact matrix 51. The operator swings cover 15 into the latched position shown in FIG. 4. Latch 30 rotates counterclockwise to allow tooth 56 to engage slot 33, thereby locking cover 15 in the closed position.

The operator then rotates knob 59 causing lead backer 28 and the projections 29 thereon to advance toward the integrated circuit leads 51. Projections 29 contact and engage leads 51, pressing them against the contacts 71. By changing the type of lead backer 28, a variety of different integrated circuits 49 may be tested.

A particular feature of this design involves projection 65 on latch 30. Projection 65 extends toward the path that knob 59 travels when moving between the retracted and the advanced positions. When knob 59 is in the retracted position as shown in FIG. 4, latch 30 can freely rotate counterclockwise to allow engaging and disengaging of tooth 56 from slot 33.

Figure 6:
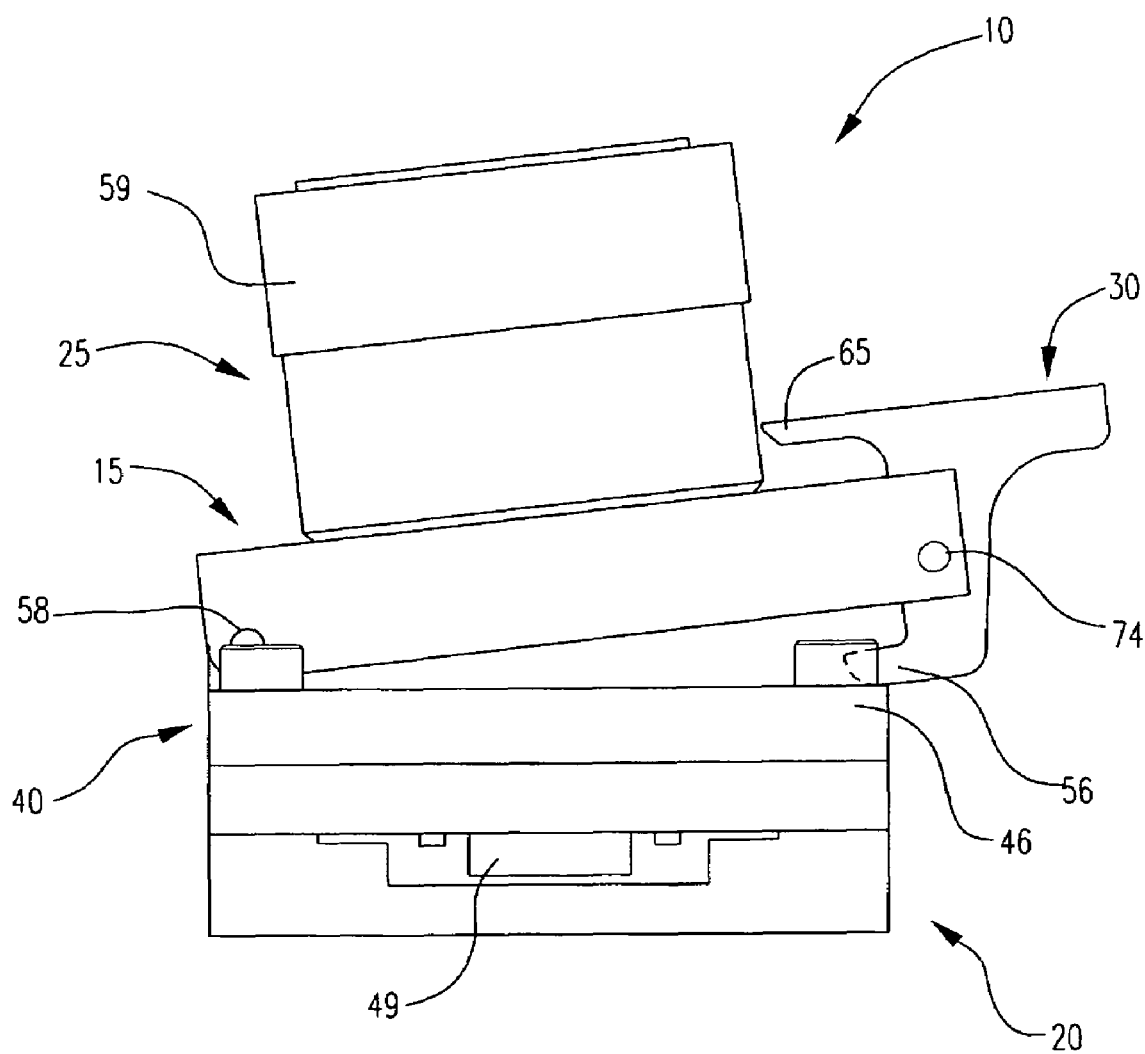
FIG. 6 is a side elevation section view of the actuator device with the cover thereof partially closed and showing how the interlock feature prevents closing of the cover with the actuator in an advanced position.

Further, when knob 59 is in the advanced position shown in FIGS. 5 and 6, latch 30 cannot rotate sufficiently counterclockwise to either allow tooth 56 to engage slot 33 or allow tooth 56 to disengage from slot 33. This arrangement creates an interlock mechanism that prevents closing and latching the cover 15 unless knob 59 and actuator 25 are in the retracted position, as shown in FIG. 6. The interference between projection 65 and knob 59 locks latch 30 in the maximum clockwise position shown in FIGS. 2-5 when knob 59 is in the advanced position.

This arrangement also prevents inadvertent opening of cover 15. When knob 59 is in the position shown in FIGS. 5 and 6, interference between projection 65 and knob 59 prevents latch 30 from rotating counterclockwise to disengage tooth 56 from slot 33 and allow cover 15 to open.

In each of these cases, this interlock mechanism prevents potential damage to alignment plate 62, integrated circuit 49, or lead backer 28. This damage can arise because of the arctuate path for lead backer 28 as cover 15 moves between the open and closed positions.

The interlock mechanism prevents closing or opening the cover 15 with the knob 59 in the advanced position. This assures that actuation only occurs when the cover 15 is latched, thereby allowing only precisely perpendicular movement of lead backer 28 relative to integrated circuit 49 while moving between the advanced and retracted positions.

The invention claimed is:

1. An actuator device for applying force to a plurality of contacts carried by an integrated circuit package and having a predetermined alignment respecting each other and the integrated circuit package to enable temporary contact between said plurality of contacts on the integrated circuit package and a set of test contacts carried by a contactor support and having a predetermined alignment compatible with the predetermined alignment of the integrated circuit package contacts, said actuator device including an alignment plate mounted on the contactor support with an opening surrounding the test contacts for aligning an integrated circuit package with respect to the test contacts, comprising:

a) a frame for attaching to the contactor support and enclosing the test contacts carried by the contactor support, and including opposing first and second walls, and having a latch engagement feature on the first wall thereof;

b) a cover hinged to the frame on the second wall, and rotatable from a closed position covering the frame to an open position;

c) a manually operable mechanical actuator element mounted on the cover and having a lead backer, said manually operable mechanical actuator element including i) a manually operable knob having a peripheral surface, and mounted for rotation on the cover, said knob movable between advanced and retracted positions relative to the cover for placing the lead backer respectively into and out of engagement with an integrated circuit package positioned within the alignment plate opening, ii) a pin on the knob, and iii) a sloped groove cooperating with the pin to cause the knob to move between the advanced and retracted positions during rotation of the knob; and d) a latch mounted on a second side of the cover opposed to the first side of the cover, and cooperating with the latch engagement feature to fasten the cover in the closed position, said latch movable between latched and unlatched positions, said latch including a projection extending toward and in interfering relation with the knob's peripheral surface when the knob is in the advanced position, whereby the knob's peripheral surface and the projection cooperate to lock the latch in a predetermined position when the knob is in the advanced position.

2. The actuator device of claim 1, wherein the knob's peripheral surface and the projection cooperate to lock the latch in the latched position when the knob is in the advanced position.

3. The actuator device of claim 2, wherein the latch includes a thickness variation in the first wall.

4. The actuator device of claim 1, wherein the latch engagement feature includes a thickness variation in the first wall.

5. The actuator device of claim 1, wherein the actuator element is mounted on the cover with an angular position allowing for precisely perpendicular movement of the knob between the advanced and retracted positions thereof with respect to the integrated circuit package when the cover is latched in the closed position.

6. The actuator device of claim 1, wherein the actuator element is mounted on the cover with an angular position allowing for precisely perpendicular movement of the lead backer with respect to the integrated circuit package when the cover is latched in the closed position.

* * * * *